United States Patent
Park et al.

(10) Patent No.: US 7,904,794 B2
(45) Date of Patent: *Mar. 8, 2011

(54) METHOD OF DETECTING AND CORRECTING A PRESCRIBED SET OF ERROR EVENTS BASED ON ERROR DETECTING CODE

(75) Inventors: Jihoon Park, Minneapolis, MN (US); Jaekyun Moon, Minneapolis, MN (US); Jun Lee, Yongin-si (KR)

(73) Assignees: Samsung Electronics Co., Ltd., Suwon-si (KR); University of Minnesota, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/623,540

(22) Filed: Nov. 23, 2009

(65) Prior Publication Data

US 2010/0162087 A1    Jun. 24, 2010

Related U.S. Application Data

(60) Division of application No. 11/384,375, filed on Mar. 21, 2006, now Pat. No. 7,644,338, which is a continuation-in-part of application No. 11/224,351, filed on Sep. 13, 2005, now Pat. No. 7,620,879.

(51) Int. Cl.
    *H03M 13/00*    (2006.01)
(52) U.S. Cl. ............... 714/781; 714/758; 714/795
(58) Field of Classification Search ............ 714/781, 714/784, 785, 758, 795
See application file for complete search history.

(56) References Cited

U.S. PATENT DOCUMENTS

| | | | |
|---|---|---|---|
| 5,844,919 A * | 12/1998 | Glover et al. ........... 714/769 |
| 6,185,173 B1 * | 2/2001 | Livingston et al. ..... 369/59.21 |
| 6,192,499 B1 * | 2/2001 | Yang ..................... 714/785 |
| 6,427,220 B1 | 7/2002 | Vityaev |
| 6,460,150 B1 | 10/2002 | Cideciyan et al. |
| 6,581,182 B1 | 6/2003 | Lee |
| 6,604,222 B1 | 8/2003 | Jensen |
| 6,640,327 B1 | 10/2003 | Hallberg |
| 6,662,334 B1 * | 12/2003 | Stenfort ................ 714/769 |
| 6,684,364 B2 | 1/2004 | Cameron |
| 6,732,328 B1 * | 5/2004 | McEwen et al. ........ 714/795 |
| 6,914,948 B2 | 7/2005 | Kuki et al. |
| 6,931,585 B1 | 8/2005 | Burd et al. |
| 6,981,201 B2 | 12/2005 | Reggiani et al. |
| 7,089,483 B2 | 8/2006 | McEwen et al. |
| 7,137,057 B2 * | 11/2006 | Williams .............. 714/774 |
| 2003/0152175 A1 | 8/2003 | Kuki et al. |

* cited by examiner

*Primary Examiner* — Esaw T Abraham
(74) *Attorney, Agent, or Firm* — Sughrue Mion, PLLC

(57) ABSTRACT

A method of constructing an effective generator polynomial for error correction by which a unique set of syndromes for each error event is produced is provided. The method includes preparing a set of dominant error events from the intersymbol interference characteristics of media; and generating a codeword from the data using a non-primitive generator polynomial that produces a unique syndrome set which completely specifies each dominant error event.

7 Claims, 6 Drawing Sheets

FIG. 4

| CODEWORD 1 | CODEWORD 1 |
|---:|:---|
| 2 | -2 |
| 2 | -2 2 |
| 2 -2 2 | -2 |
| 2 | -2 2 -2 2 |
| 2 -2 2 -2 2 | -2 |

FIG. 5

| SYNDROME FOR CODEWORD 1 | SYNDROME FOR CODEWORD 2 |
|:---:|:---:|
| 13 | 16 |
| 13 |  |
| 21 | 16 |
| 13 |  |
| 19 | 16 |

METHOD OF DETECTING AND CORRECTING A PRESCRIBED SET OF ERROR EVENTS BASED ON ERROR DETECTING CODE

CROSS-REFERENCE TO RELATED APPLICATIONS

This is a Divisional Application of U.S. patent application Ser. No. 11/384,375 filed Mar. 21, 2006, issued as U.S. Pat. No. 7,644,338, which is a continuation-in part of prior U.S. patent application Ser. No. 11/224,351 filed Sep. 13, 2005, issued as U.S. Pat. No. 7,620,879, the entire contents of which are incorporated herein by reference.

BACKGROUND OF THE INVENTION

1. Field of the Invention

The present invention relates to an error correction coding method and a Post-Viterbi processor, and more particularly, to a method of generating an effective generator polynomial for error correction by which a unique set of syndromes for each error event is produced and an error detection method for the same.

2. Description of the Related Art

It is well known that the performance of a partial response maximum likelihood (PRML) system can be improved by employing a Post-Viterbi processor that corrects dominant error events at the output of a detector. The idea is that once an error is detected, an attempt is made to correlate an estimated error signal with each of known forms of the dominant error patterns and identify the most likely error pattern and its position within a code word. The estimated error signal is constructed by taking a difference between an actual equalizer output and a Viterbi detector output stream convolved with an equalizer target response.

FIG. 1 illustrates a conventional Post-Viterbi processor. Referring FIG. 1, the Post-Viterbi processor comprises a target encoder 110, a bank of error correlation filters 114, a selector 116, an error detection coding encoder (EDC) decoder 118 and an error correction unit 120.

Data is encoded by an EDC encoder 102 before it is transmitted through a readback channel 104, which is, as well known, a part of a PRML system. An equalizer 106 equalizes data received through a readback channel 104 and then a maximum likelihood (ML) detector 108 detects the encoded data from the equalized data based on Viterbi algorithm. However, the detected data from the ML detector 108 may contains errors caused by noise on the readback channel 104.

The Post-Viterbi processor, shown in FIG. 1, performs error correction on dominant error events, so that the possibility of error correction can be increased.

In general, cyclic redundancy check (CRC) is used as an EDC. A conventional CRC code usually plays a single role in the detection of an occurrence of a dominant error event in a codeword, not yielding any information about the type and the position of the detected dominant error event. Accordingly, a Post-Viterbi processor has been utilized in order to find the type and the position of the detected dominant error event.

The idea of the Post-Viterbi processor is that once the error is detected, an attempt is made to correlate the estimated error signal with each of known forms of the dominant error patterns and identify the most likely error pattern and its position within the codeword. The estimated error signal is constructed by taking a difference between the actual equalizer output and the Viterbi detector output stream convolved with the equalizer target response.

The bank of error correlation filters 114 comprises of a bank of matched filters, each of which being associated with one of dominant error events. Each of matched filters produces a likelihood value for its assigned type of error events. The selector 116 selects the largest likelihood value among outputs of the bank of matched filters. The correction unit 120 corrects error event, which is occurred in the estimated data by the ML detector 108, through finding the error type and the position from the selector 116.

A set of dominant error events contains $\pm[2, -2]$, $\pm[2, -2, 2]$, $\pm[2, -2, 2, -2]$, $\pm[2, -2, 2, -2, 2]$, $\pm[2, -2, 0, 2, -2]$ and $\pm[2, -2, 2, -2, 2, -2]$ at density 1.4 under 50% additive white Gaussian noise (AWGN) and 50% medium noise in perpendicular recording. Thus, a total of at least six error correlation filters are associated with these error events. Therefore, once an error detection code detects any dominant error event based on syndrome checked by the EDC decoder 118, it may be corrected based on the information about the error type and its location provided by the bank of the error correlation filters. But, because of intersymbol interference (ISI) and noise, the Post-Viterbi processor often gives wrong information about the type and position of a detected dominant error event, which is called miscorrection.

The miscorrection consists of misselection and mispositioning. The misselection and mispositioning respectively mean the wrong selection of the error type and providing incorrect location for the selected error type.

Thus, there is a need for an error correction method that can produce a unique set of syndromes for each dominant error event so that the type of an occurred dominant error event can be immediately determined by one syndrome computation without any ambiguity and likely error position can also be obtained based on the syndrome and its period of the corresponding syndrome set, considerably reducing the probability of miscorrection.

SUMMARY OF THE INVENTION

According to one aspect of the present invention, there is provided a method for generating a codeword from data, comprising: preparing a set of dominant error events from the intersymbol interference characteristics of media; and generating a codeword from the data using a non-primitive generator polynomial that produces a unique syndrome set which can completely specify each dominant error event.

According to another aspect of the present invention, there is provided a method for detecting and correcting error event in data, comprising: receiving an erroneous codeword from a media; detecting an occurrence of an error event in the received codeword whenever a non-zero syndrome is produced from the received codeword; determining an exact type of the detected dominant error event based on the non-zero syndrome; determining a set of likely error starting positions using the syndrome set including the non-zero syndrome; determining the actual error starting position among the likely error positions; and correcting the dominant error event based on the type and the actual error starting position.

According to still another aspect of the present invention, there is provided a method for detecting and correcting error event in data, comprising: receiving an erroneous codeword from a media, wherein the codeword is generated from source data using a non-primitive generator polynomial that produces a unique syndrome set which can completely specify each dominant error event; detecting an occurrence of an error event in the received codeword whenever a non-zero syndrome is produced from the received codeword; determining an exact type of the detected dominant error event based on the non-zero syndrome; and determining a set of likely error starting positions using the syndrome set including the non-zero syndrome; determining the actual error starting position among the likely error positions; and correcting the dominant error event based on the type and the actual error starting position.

BRIEF DESCRIPTION OF THE DRAWINGS

The above and/or other aspects of the invention will become apparent and more readily appreciated from the following description of the exemplary embodiments of the present invention, taken in conjunction with the accompanying drawings of which:

FIG. 4 illustrates end-around cases producing a single error event±[2] in case of the Post-Viterbi processor of FIG. 3;

FIG. 5 illustrates syndrome values for the end-around cases producing single error event±[2] shown in FIG. 4;

DETAILED DESCRIPTION OF THE EXEMPLARY EMBODIMENTS

Figure 1:
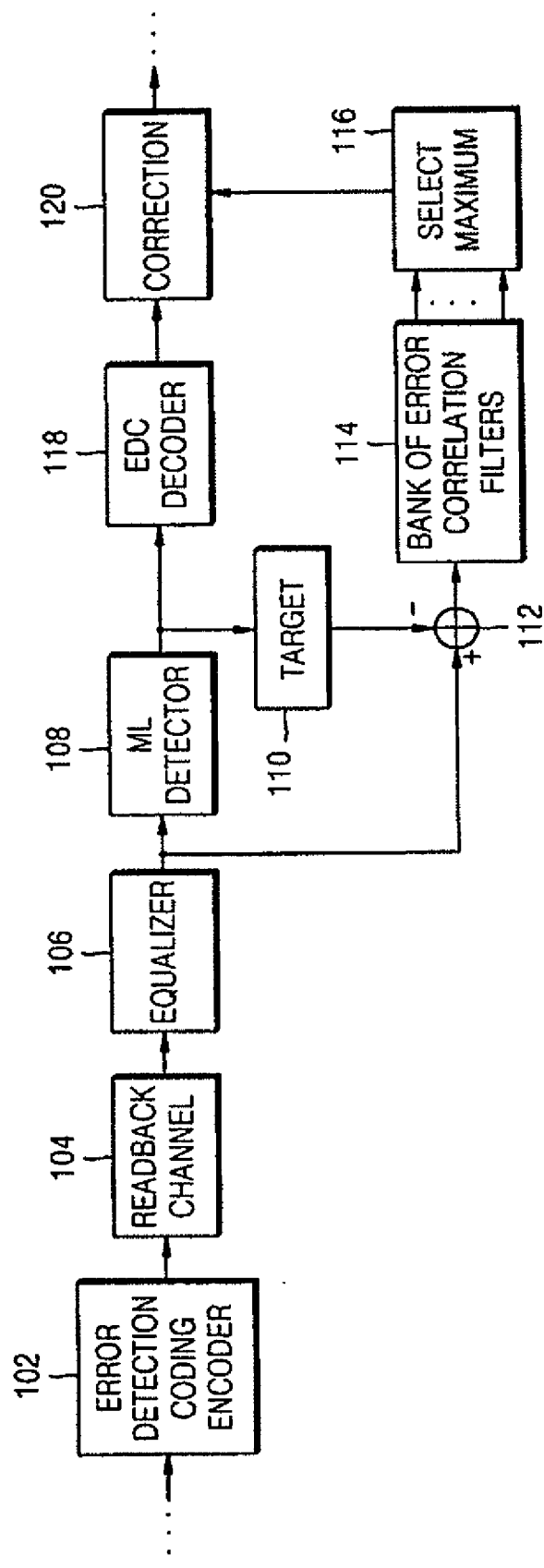
FIG. 1 illustrates a conventional Post-Viterbi processor.

Reference will now be made in detail to the exemplary embodiments of the present invention, examples of which are illustrated in the accompanying drawings, wherein like reference numerals refer to the like elements throughout. The exemplary embodiments are described below to explain the present invention by referring to the figures.

Table I shows dominant error events and their frequencies associated with each signal-to-noise ratio (SNR) and bit error rate (BER), at density 1.4 under the assumption of 50% AWGN and 50% medium noise. In Table 1, an error event is considered as a dominant error event when its frequency is greater or almost equal to 1%, compared to all occurred error events. Although the order of dominant error events for each SNR is somehow different, the set of dominant error events is the same for all SNRs. Thus, a set of dominant error events contains ±[2, −2], ±[2, −2, 2], ±[2, −2, 2, −2], ±[2, −2, 2, −2, 2], ±[2, −2, 0, 2, −2] and ±[2, −2, 2, −2, 2, −2] at density 1.4.

Here, the dominant error events can be obtained from the effective distance analysis and/or computer simulations at various densities mixed noise environments. Among them, the dominant error events at density 1.4 under the mixed noise consisting of 50% AWGN and 50% medium noise are listed in Table 1. A hyperbolic tangent transition response can be assumed with equalizer target response of $1+6D+7D^2+2D^3$ employed. The equalizer target response depends on density and the mixed noise, reflecting the intersymbol interference characteristics of media, such like magnetic recording media, communication channel.

TABLE 1

Dominant error events in perpendicular recording at density 1.4

| $E_d/N_{50}$ (dB)/BER | Dominant error events | | | | | | Frequency (%) |
|---|---|---|---|---|---|---|---|
| 17 ($8.4700 \times 10^{-4}$) | ±[2 | −2] | | | | | 59.2814 |
| | ±[2 | −2 | 2] | | | | 19.8935 |
| | ±[2 | −2 | 2 | −2] | | | 6.1211 |
| | ±[2 | −2 | 2 | −2 | 2] | | 4.1916 |
| | ±[2 | −2 | 0 | 2 | −2] | | 2.9275 |
| | ±[2 | −2 | 2 | −2 | 2 | −2] | 1.7964 |
| | | | | | | | (94.2116) |
| 18 ($1.6600 \times 10^{-4}$) | ±[2 | −2] | | | | | 63.8957 |
| | ±[2 | −2 | 2] | | | | 19.2339 |
| | ±[2 | −2 | 2 | −2] | | | 5.4605 |
| | ±[2 | −2 | 2 | −2 | 2] | | 3.4230 |
| | ±[2 | −2 | 0 | 2 | −2] | | 1.8745 |
| | ±[2 | −2 | 2 | −2 | 2 | −2] | 1.7930 |
| | | | | | | | (95.6805) |
| 19 ($2.2600 \times 10^{-5}$) | ±[2 | −2] | | | | | 67.8082 |
| | ±[2 | −2 | 2] | | | | 19.5205 |
| | ±[2 | −2 | 2 | −2] | | | 4.6804 |
| | ±[2 | −2 | 2 | −2 | 2] | | 2.6256 |
| | ±[2 | −2 | 2 | −2 | 2 | −2] | 1.8265 |
| | ±[2 | −2 | 0 | 2 | −2] | | 1.5982 |
| | | | | | | | (98.0594) |
| 20 ($2.2520 \times 10^{-6}$) | ±[2 | −2] | | | | | 65.5340 |
| | ±[2 | −2 | 2] | | | | 18.9320 |
| | ±[2 | −2 | 2 | −2 | 2] | | 4.8544 |
| | ±[2 | −2 | 2 | −2] | | | 3.8835 |
| | ±[2 | −2 | 2 | −2 | 2 | −2] | 2.9126 |
| | ±[2 | −2 | 0 | 2 | −2] | | 0.9709 |
| | | | | | | | (97.0874) |

A CRC code is specified by its generator polynomial and the CRC value is the remainder when a received codeword polynomial is divided by the generator polynomial. For an (n, k) CRC code based on a generator polynomial g(x) of degree (n−k), a data polynomial b(x) of degree (k−1) or less is encoded into a codeword polynomial c(x) of degree (n−1) or less, i.e., $$c(x)=c_0+c_1x+c_2x^2+\ldots+c_{n-1}x^{n-1}=p(x)+x^{n-k}b(x)=g(x)Q(x) \quad (1)$$

where the parity polynomial p(x) is the remainder when a shifted data polynomial $x^{n-k}b(x)$ is divided by the generator polynomial g(x), and Q(x) is the quotient.

Suppose that c̃(x) is a readback polynomial with some errors. Let s(x) be the CRC value of c̃(x), i.e., the syndrome which has degree less than (n−k). Then, c̃(x) can be expressed as $$\tilde{c}(x)=c(x)+e(x)=g(x)q(x)+s(x) \quad (2)$$

where e(x) is an error polynomial of degree (n−1) or less, q(x) is the quotient, and the division is performed over a binary Galois field, GF(2). For the erroneous readback polynomial c̃(x), if the syndrome s(x) is not the zero polynomial, then the CRC checker detects the error e(x), otherwise, it fails to detect it.

While it is obvious that the degree (n−k) of a generator polynomial g(x), which is the number of parity bits required, should be greater than the highest degree of all given dominant error polynomials to certify error detection capability, it is desirable to find a generator polynomial having the smallest possible degree for a high-rate error-detection code. Also, since a primitive generator polynomial yields the largest number of distinct syndromes, which would be useful for many purposes, the detectability is examined with primitive polynomial(s) of as small degree as possible.

Suppose a length-l dominant error polynomial $e^{(p)}(x)$ occurred within a length-n codeword is given by $$e^{(p)}(x)=x^p \cdot (e_0+e_1x+e_2x^2+\ldots+e_{l-1}x^{l-1}) \quad (3)$$

where $0 \leq \rho \leq n-1$. When $\rho$ is n-1, the length-1 dominant error event ends at the last position of a codeword. It is well known that a primitive polynomial p(x) of degree m divides $x^n+1$, where n is the multiple of $(2^m-1)$, but x is not a factor of p(x). Consequently, $x^\rho$ must not be divided by p(x). Thus, once a primitive polynomial p(x) gives non-zero syndromes for $e^{(0)}$(x), its shifted version within a codeword, $e^{(\rho)}(x)$ for $0<\rho \leq n-1$, must not be divisible by p(x).

Although error detection has been successful for any dominant error event which occurred within a codeword, its boundary should also be considered to confirm the full detectability. A dominant error event occurred at codeword boundary, $e_t^{(\eta)}(x)$, which is a truncated version of $e^{(\eta)}(x)$ can be represented as $$e_t^{(\eta)}(x) = x^\eta \cdot (e_0 + e_1 x + e_2 x^2 + \ldots + e_{n-\eta-1} x^{n-\eta-1}) \quad (4)$$

where $n-1+1 \leq \eta \leq n-1$. Here additional divisions are not necessary to check non-zero syndromes, but whether the truncated polynomial $e_0 + e_1 x + e_2 x^2 + \ldots + e_{n-\eta-1} x^{n-\eta-1}$ of any dominant error event is equivalent to the primitive polynomial p(x), i.e., $e_t^{(\eta)}(x) = x^\eta \cdot p(x)$, is rather scrutinized. If there is no such a case, error detection capability is guaranteed at codeword boundary, too.

One may argue that a dominant error event at another boundary, which is occurred at the previous codeword and ended in the present codeword, i.e., $$e_t^{(\delta)}(x) = (e_\delta + e_{\delta+1} x + e_{\delta+2} x^2 + \ldots + e_{l-1} x^{l-\delta-1}) \quad (5)$$

where $1 \leq \delta \leq l-1$, has to be also surveyed for the detectability test. However, the error event $e_t^{(\delta)}(x)$ is nothing but $e_t^{(\eta)}(x)$ given in (4) in terms of the previous codeword block. As long as the detection of $e_t^{(\eta)}(x)$ is guaranteed, a Post-Viterbi processor attempts to correct the detected error event associated with the previous codeword. So, it is not necessary to have additional detectability test for the error event $e_t^{(\delta)}(x)$.

Therefore, given any set of dominant error events at a wide range of density and mixed noise environment, when it is found through simple polynomial divisions and boundary checks that a primitive polynomial p(x) of the smallest possible degree always produces non-zero syndromes for any dominant error events within a codeword as well as at its boundary, then p(x) can be applied as the generator polynomial of a high-rate CRC error detection code.

TABLE 2

Remainders dividing dominant error e(x) by $p(x) = 1 + x + x^3$ or $p(x) = 1 + x^2 + x^3$

| Dominant error polynomial e(x) at density 1.4 | Remainder $(p(x) = 1 + x + x^3)$ | Remainder $(p(x) = 1 + x^2 + x^3)$ |
|---|---|---|
| $(1 + x)$ | $(1 + x)$ | $(1 + x)$ |
| $(1 + x + x^2)$ | $(1 + x + x^2)$ | $(1 + x + x^2)$ |
| $(1 + x + x^2 + x^3)$ | $x^2$ | $x$ |
| $(1 + x + x^2 + x^3 + x^4)$ | $x$ | $(1 + x^2)$ |
| $(1 + x + x^3 + x^4)$ | $(x + x^2)$ | $1$ |
| $(1 + x + x^2 + x^3 + x^4 + x^5)$ | $(1 + x^2)$ | $(x + x^2)$ |

For the set of dominant error events in perpendicular recording shown in Table 1, it can be easily seen that the degree-2 primitive polynomial $1+x+x^2$ clearly divides a dominant error polynomial $(1+x+x^2)$, so it is disregarded and the degree-3 polynomials are cast.

It is demonstrated in Table 2 that both degree-3 primitive polynomials $1+x+x^3$ and $1+x^2+x^3$ yield non-zero remainders for all the dominant error polynomials listed in Table 1. The non-divisibility signifies the detection capability of any shifted version of the dominant error events within a codeword. However, it is found that if a dominant error event $\pm[2, -2, 0, 2, -2]$ occurs at codeword boundaries, resulting into $\pm[2, -2, 0, 2]$, the error event can not be detected by $1+x+x^3$ because its error polynomial is in the form of $x^{n-4}(1+x+x^3)$. But, the other degree-3 primitive polynomial $1+x^2+x^3$ still produces non-zero syndromes for any dominant error event occurred at codeword boundary. Accordingly, a (n, n-3) CRC code generated by generator polynomial $g(x) = 1+x^2+x^3$ can detect any single occurrence of all dominant error events both within a codeword and at its boundary.

If a higher-degree primitive polynomial is utilized regardless of the rate penalty, it apparently guarantees the error detection capability for all dominant error events although there are some exceptional polynomials such as $1+x+x^4$ and $1+x+x^3+x^4+x^6$ because they can respectively divide dominant error events $\pm[2, -2, 0, 0, 2]$, i.e., $X^{n-5}(1+x+x^4)$, and $\pm[2, -2, 0, 2, -2, 0, 2]$, i.e., $x^{n-7}(1+x+x^3+x^4+x^6)$ occurred at codeword boundary. However, as the degree of generator polynomial is increased, it provides worse burst error propagation, compromising the correction capability of the outer error correction code (ECC).

In a search for a primitive generator polynomial of the smallest possible degree for error detection, e.g., $g(x) = 1+x^2+x^3$, the codeword length n is chosen to 203, balancing between code rate loss and error correction capability of a Post-Viterbi processor. Hence, a (203, 200) CRC code generated by $g(x) = 1+x^2+x^3$ has been exploited as the error detection code.

Once the CRC code gives a non-zero syndrome for any error event(s), i.e., dominant error event or non-dominant error event, an attempt is made by a Post-Viterbi processor tries to correlate the estimated error signal with each of known forms of the dominant error patterns and identify the most likely error pattern and its position within a codeword. However, it is observed that there are some miscorrections of a Post-Viterbi processor due to correlated noise and residual inter-symbol interference (ISI). The miscorrection contains mis-selecting and mispositioning of an occurred dominant error event, and there has been miscorrection for a detected dominant error event.

As an example of misselection, the most dominant error event $\pm[2, -2]$ is often judged by a Post-Viterbi processor as $\pm[2, -2, 2]$ or $\pm[2, -2, 0, 2, -2]$. A dominant error event $\pm[2, -2, 2]$ is also occasionally determined as $\pm[2, -2]$ or $\pm[2, -2, 2, -2]$. Likewise, the selection of dominant error event $\pm[2, -2, 2, -2, 2]$ or $\pm[2, -2, -2, 2, -2]$ by a Post-Viterbi processor is sometimes wrong. In addition to the misselection of an occurred dominant error event, there has been misposition of a correctly selected dominant error event.

For example, dominant error events $\pm[2, -2]$ and $\pm[2, -2, 2]$ become $\pm[2, 0, 2]$ and $\pm[2, 0, 0, 2]$, respectively, due to the misposition of the dominant error events. Thus, although a CRC error detection code based on a primitive generator polynomial gives full detectability for any single occurrence of dominant error events, the miscorrection of the detected dominant error events detriments the error correction capability of a Post-Viterbi processor.

Thus it seems natural to think about an error detection code that gives information about which type of dominant error event occurs. The dominant error events and their polynomial forms at density 1.4 are listed again in Table 3.

TABLE 3

Dominant error events and their polynomial forms at density 1.4

| Actual form | Polynomial form |
|---|---|
| ±[2, −2] | $1 + x$ (irreducible) |
| ±[2, −2, 2] | $1 + x + x^2$ (irreducible) |
| ±[2, −2, 2, −2] | $1 + x + x^2 + x^3 = (1 + x)(1 + x^2) = (1 + x)^3$ |
| ±[2, −2, 2, −2, 2] | $1 + x + x^2 + x^3 + x^4$ (irreducible) |
| ±[2, −2, 0, 2, −2] | $1 + x + x^3 + x^4 = (1 + x)(1 + x^3) = (1 + x)^2(1 + x + x^2)$ |
| ±[2, −2, 2, −2, 2, −2] | $1 + x + x^2 + x^3 + x^4 + x^5 = (1 + x + x^2)(1 + x^3)$ |

Since a primitive generator polynomial of degree m produces the same syndrome sequence of period $(2^m-1)$ for any dominant/non-dominant error events, the type of an occurred error event cannot be determined, but detect the occurrence of any error event whose syndrome is non-zero.

With a primitive generator polynomial $g(x)=1+x^2+x^3$, Table 4 shows the syndrome sequence in decimal number associated with each dominant error event. The first syndrome value in the second column means the syndrome value when a corresponding dominant error event starts to occur in the first position in a codeword block.

For example, syndrome value 6 (actually, the syndrome is [1 1 0]) for a dominant error polynomial 1+x (on the first row in Table 4) indicates that the error event starts to occur in the $1^{st}$ position in a received codeword block. Likewise, syndrome value 6 for a dominant error event $1+x+x^2+x^3$ (on the $3^{rd}$ row in Table 4) is the syndrome value when the error event starts to occur in the $5^{th}$ position in a received codeword block. Since all the syndrome sequences are a repeated version of a period-7 syndrome sequence [6, 3, 4, 2, 1, 5, 7], it cannot be determined which dominant error event occurs. This is because a primitive generator polynomial is employed, i.e., the period of $g(x)=1+x^2+x^3$ is 7.

TABLE 4

Syndrome sequence with a primitive generator polynomial
$g(x) = 1 + x^2 + x^3$

| Dominant error polynomial | Syndrome sequence in decimal number |
|---|---|
| $1 + x$ | 6 3 4 2 1 5 7 |
| $1 + x + x^2$ | 7 6 3 4 2 1 5 |
| $1 + x + x^2 + x^3$ | 2 1 5 7 6 3 4 |
| $1 + x + x^2 + x^3 + x^4$ | 5 7 6 3 4 2 1 |
| $1 + x + x^3 + x^4$ | 4 2 1 5 7 6 3 |
| $1 + x + x^2 + x^3 + x^4 + x^5$ | 3 4 2 1 5 7 6 |

However, when a non-primitive generator polynomial of degree m is applied, its period must be less than $(2^m-1)$. Thus, the syndrome values associated with each dominant error event might be different. Using the property and the given set of dominant error events, a non-primitive generator polynomial which produces unique set of syndrome sequence associated with each dominant error event is considered.

Figure 2:
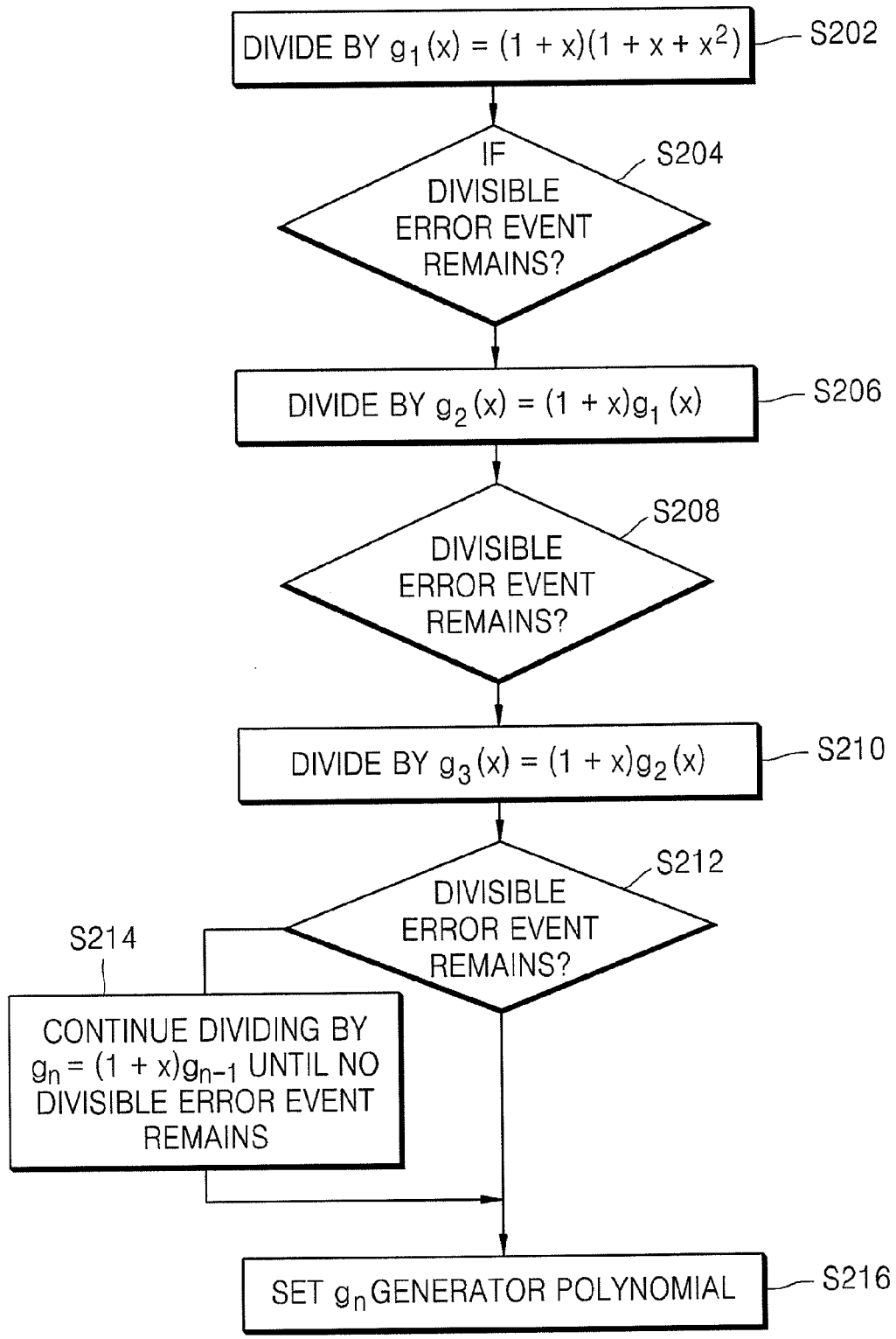
FIG. 2 illustrates a method of constructing a non-primitive generator polynomial according to an exemplary embodiment of the present invention.

FIG. 2 illustrates a method of generating a non-primitive generator polynomial according to an exemplary embodiment of the present invention.

In operation S202, main dominant error events are divided by the irreducible polynomials (1+x) and $(1+x+x^2)$, respectively. For example, Main dominant error events ±[2, −2] and ±[2, −2, 2] are divided by the irreducible polynomials (1+x) and $(1+x+x^2)$, respectively. But, they are not divisible by $g_1(x)=(1+x)(1+x+x^2)=(1+x^3)$, having a period of 3, and their syndrome values are different. A dominant error event ±[2, −2, 2, −2] is not divisible by $g_1(x)$, but its syndrome sequence is the same as that of ±[2, −2]. Also, $g_1(x)$ divides other dominant error events ±[2, −2, 0, 2, −2] and ±[2, −2, 2, −2, 2, −2].

In operation S204, it is determined whether there remains any divisible error event.

If it is determined in operation S204 that there are dominant error events which are divisible by $g_1(x)$, then $g_2(x)=(1+x)g_1(x)=1+x+x^3+x^4$ is now considered (period=6) in operation S206. Then, syndrome sequences for ±[2, −2], ±[2, −2, 2], ±[2, −2, 2, −2], ±[2, −2, 2, −2, 2] and ±[2, −2, 2, −2, 2, −2] are different from each other. However, ±[2, −2, 0, 2, −2] is divisible by $g_2(x)$. Thus, if an error event ±[2, −2, 0, 2, −2] is not dominant, then $g_2(x)$ can be applied as a generator polynomial.

TABLE 5

Syndrome sequence with a non-primitive generator polynomial
$g_2(x) = 1 + x + x^3 + x^4$

| Dominant error events | Syndrome by $g_2(x)$ in polynomial form | Syndrome sequence in decimal number |
|---|---|---|
| ±[2, −2] | $1 + x$ | [12, 6, 3] |
| ±[2, −2, 2] | $1 + x + x^2$ | [14, 7] |
| ±[2, −2, 2, −2] | $1 + x + x^2 + x^3$ | [15, 10, 5] |
| ±[2, −2, 2, −2, 2] | $x^2$ | [2, 1, 13, 11, 8, 4] |
| ±[2, −2, 0, 2, −2] | 0 | 0 |
| ±[2, −2, 2, −2, 2, −2] | $1 + x^3$ | [9] |

With the generator polynomial $g_2(x)=1+x+x^3+x^4$, Table 5 shows syndrome sequences for all dominant error events at density 1.4. Since syndrome sequences are all different for all dominant error events except for an undetected dominant error event ±[2, −2, 0, 2, −2], the type of an occurred dominant error event can be determined. But, because of the undetected dominant error event ±[2, −2, 0, 2, −2], other non-primitive generator polynomial of the same degree 4 have to be considered. However, it is found that any other polynomial of degree up to 4 does not produce all different syndrome sequences for all dominant error events. Accordingly, a higher degree non-primitive generator polynomial, i.e., degree is greater than or equal to 5 is considered.

Then, in operation S208, it is determined whether there remains any divisible error event.

If it is determined in operation S208 that there are dominant error events which are divisible by $g_2(x)$, then in operation S210 $g_3(x)=(1+x)g_2(x)=1+x^2+x^3+x^5$ is considered (period=12). For the detection of an error event ±[2, −2, 0, 2, −2], $g_3(x)=(1+x)g_2(x)=1+x^2+x^3+x^5$ is considered. Then, all dominant error events are detected, and their syndrome sequences are all different.

Table 6 lists syndrome sets associated with dominant error events. The syndrome set is a collection of all possible syndrome values for a given error event, depending on its starting position within some sub-block of the codeword. All dominant error events at density 1.4 are successfully detected within a codeword, and the corresponding syndrome sets are different from each other.

TABLE 6

Syndrome sets with a non-primitive generator polynomial
$g_3(x) = 1 + x^2 + x^3 + x^5$

| Dominant error events | Syndrome by $g_3(x)$ in polynomial form | Syndrome sequence in decimal number |
|---|---|---|
| ±[2, −2] | $1 + x$ | [24, 12, 6, 3, 23, 29] |
| ±[2, −2, 2] | $1 + x + x^2$ | [28, 14, 7, 21] |
| ±[2, −2, 2, −2] | $1 + x + x^2 + x^3$ | [30, 15, 17] |
| ±[2, −2, 2, −2, 2] | $1 + x + x^2 + x^3 + x^4$ | [31, 25, 26, 13, 16, 8, 4, 2, 1, 22, 11, 19] |
| ±[2, −2, 0, 2, −2] | $1 + x + x^3 + x^4$ | [27] |
| ±[2, −2, 2, −2, 2, −2] | $x + x^4$ | [9, 18] |

The periods of the syndrome sets for all dominant error events can also be computed analytically as follows:

±[2, −2]: Since it is divisible by (1+x), the period of syndrome sequence must be 6 because the other factors of $g_3(x)$ are $(1+x)^2(1+x+x^2)$ and the period is 6.
S=[24, 12, 6, 3, 23, 29]

±[2, −2, 2]: Since it is divisible by $(1+x+x^2)$, the period of syndrome sequence must be 4 because the period of the other factors $(1+x)^3$ is 4.
S=[28, 14, 7, 21]

±[2, −2, 2, −2]: Since it is divisible by $(1+x)^3$, the period of syndrome sequence must be 3 because the period of the other factors $(1+x+x^2)$ is 3.
S=[30, 15, 17]

±[2, −2, 2, −2, 2]: Since it is not divisible by $g_3(x)$, the period of syndrome sequence must be 12 because the period of $g_3(x)$ is 12.
S=[31, 25, 26, 13, 16, 8, 4, 2, 1, 22, 11, 19]

±[2, −2, 0, 2, −2]: Since it is divisible by $(1+x)^2(1+x+x^2)$, the period of syndrome sequence must be 1 because the period of the other factors (1+x) is 1.
S=[27]

±[2, −2, 2, −2, 2, −2]: Since it is divisible by $(1+x)(1+x+x^2)$, the period of syndrome sequence must be 2 because the period of the other factors $(1+x)^2$ is 2.
S=[9, 18]

It is seen in Table 6 that with a non-primitive generator polynomial $g_3(x)=1+x^2+x^3+x^5$, there is no repeated syndrome value for all dominant error events.

In operation S212, it is determined whether there remains any divisible error event.

If it is determined in operation S212 that there are dominant error events which are divisible by $g_3(x)$ In 414 step, then it is in operation S214 continued to consider $g_n(x)=(1+x)g_{n-1}(x)$.

If it is determined in operation S214 that there are no dominant error events, which are divisible by $g_n(x)$, then in operation S216 the last $g_n(x)$ is set as a generator polynomial.

Since there are no dominant error events which are divisible by $g_3(x)$. In operation S212, then the last polynomial $g_3(x)=(1+x)g_2(x)=1+x^2+x^3+x^5$ is determined as a good non-primitive generator polynomial according to an exemplary embodiment of the present invention.

There exists a general design guideline for constructing a good non-primitive generator polynomial that produces unique syndrome set. The unique syndrome set is not overlapped with any other syndrome sets.

Suppose that there is a prescribed set of L error patterns, given an intersymbol interference (ISI) channel.

Then, each prescribed error pattern can be factorized into N different irreducible polynomials.

The maximum among powers of each irreducible factor, where at least two degrees are not zero, is obtained.

Based on the information about irreducible factors and their maximum degrees, a non-primitive generator polynomial (NPG) which completely specifies each prescribed error pattern can be obtained by multiplication of induced irreducible factors associated with their respective maximum degrees.

Once a syndrome is computed from an erroneous codeword including a dominant error event with a conventional feedback shift register, the type of the occurred dominant error event within the codeword can be immediately determined.

As an example, if a syndrome in a decimal number is 24, i.e., the actual syndrome is [1 1 0 0 0], for an occurred dominant error event within a codeword, then the detected dominant error event must be ±[2, −2] without any ambiguity. Likewise, if a syndrome for a dominant error event is 16, then the occurred dominant error event must be ±[2, −2, 2, −2, 2].

Besides determination of the type of an occurred dominant error event, likely locations of the occurred error event based on its syndrome value can be also estimated. For example, assuming that a syndrome value for a single dominant error event within a codeword is 6, the type of the error event, i.e., ±[2, −2], can be decided. Since the period-6 syndrome set associated with a dominant error event±[2, −2] is a repeated version of [24, 12, 6, 3, 23, 29], i.e., [24, 12, 6, 3, 23, 29, 24, 12, 6, 3, 23, 29, . . . ], the likely starting locations of the occurred error event±[2, −2] either 3, 9, 15, 21, . . . , and (6k−3), where k=1, . . . , n/6 and n is the codeword length.

TABLE 7

Likely error starting positions of the error event ±[2, −2] based on its syndrome value is 6

| | Position | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | ... | (6k − 5) | (6k − 4) | (6k − 3) | (6k − 2) | (6k − 1) | (6k) |
| Syndrome | 24 | 12 | 6 | 3 | 23 | 29 | 24 | 12 | 6 | 3 | 23 | 29 | ... | 24 | 12 | 6 | 3 | 23 | 29 |

Table 7 lists the syndrome values in decimal numbers and likely starting position for a dominant error event±[2, −2], assuming its syndrome is 6. Since the syndrome value 6 is unique for a dominant error event±[2, −2] only, an actual error starting position must be in the set of the likely positions. Moreover, from the set of likely starting positions of the error event±[2, −2], the size of the set can be reduced if only opposite binary bits between those starting position and ending position, i.e., either [1 0] or [0 1] can be found, because the actual error event [2, −2] is either [2, −2] or [−2, 2]. Thus, the set of more likely error positions, i.e., search space, can be found.

As an example, suppose that a (36, 31) CRC code based on $g_3(x)=1+x^2+x^3+x^5$ is employed as an error detection code and a dominant error event [−2, 2] occurs in positions 3 and 4 within the codeword. The syndrome for the erroneous codeword r is 6. Thus, a dominant error event [1 1] occurs in the codeword. The syndrome value 6 indicates a set of likely starting positions of the error event, i.e., t={3, 9, 15, 21, 27 and 33}. Since the error event is in the form of [2, −2] or [−2, 2], a set of more likely starting positions, s from the set t, can be obtained, considering bits between each likely starting position and ending position. Table 8 summarizes this procedure.

TABLE 8

Finding likely positions for an occurred error event ± [2, −2] based on its syndrome

| Position | 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|---|
| C | 0 | 0 | 0 | 1 | 0 | 0 | 1 | 0 | 1 | 0 | 0 | 0 | 0 | 1 | 1 | 1 | 1 | 1 | 1 | 1 | 0 |
| E | 0 | 0 | 1 | 1 | 0 | 0 | 0 | 0 | 0 | 0 | 0 | 0 | 0 | 0 | 0 | 0 | 0 | 0 | 0 | 0 | 0 |
| R | 0 | 0 | 1 | 0 | 0 | 0 | 1 | 0 | 1 | 0 | 0 | 0 | 0 | 1 | 1 | 1 | 1 | 1 | 1 | 1 | 0 |
| T | | | 3 | 4 | | | | | 9 | 10 | | | | | 15 | 16 | | | | | 21 |
| S | | | 3 | 4 | | | | | 9 | 10 | | | | | | | | | | | 21 |

| Position | 22 | 23 | 24 | 25 | 26 | 27 | 28 | 29 | 30 | 31 | 32 | 33 | 34 | 35 | 36 |
|---|---|---|---|---|---|---|---|---|---|---|---|---|---|---|---|
| C | 1 | 1 | 1 | 1 | 0 | 0 | 0 | 0 | 0 | 0 | 1 | 0 | 0 | 1 | 0 |
| E | 0 | 0 | 0 | 0 | 0 | 0 | 0 | 0 | 0 | 0 | 0 | 0 | 0 | 0 | 0 |
| R | 1 | 1 | 1 | 1 | 0 | 0 | 0 | 0 | 0 | 0 | 1 | 0 | 0 | 1 | 0 |
| T | 22 | | | | | 27 | 28 | | | | | 33 | 34 | | |
| S | 22 | | | | | | | | | | | | | | | c: transmitted codeword ($cH^T$ = [00000])
e: error event ([11])
r: ML codeword ($rH^T$ = 6 = [00110])
t: set of likely starting positions of the error event on syndrome
s: set of more likely starting positions on the sign of bits (Search space)

As in Table 8, assuming a single dominant error event within a codeword, the type of the occurred dominant error event is precisely determined, and its likely occurring positions are also induced through the procedure given above. Thus, the new error detection code based on a non-primitive generator polynomial gives substantially less miscorrection compared to an error detection code based on a primitive generator polynomial.

A new CRC error detection code based on a non-primitive generator polynomial $g_3(x)=1+x^2+x^3+x^5$ can determine the type of a detected dominant error event within a codeword, while a conventional CRC error detection code based on a primitive generator polynomial cannot give information about the type. In addition, the new CRC code yields likely locations for the occurred dominant error event, which is very helpful to reduce the probability of miscorrection.

For the correction of a detected dominant error event, all error correlation filters should work to find the error type and its location in a conventional Post-Viterbi processor. However, since the type of an occurred dominant error event is determined only by syndrome computation with the new CRC error detection code, only one error correlation filter associated with the type of a dominant error event tries to find the actual location. Obviously, this can reduce the probability of misselection. Moreover, the new CRC error detection code also produces likely locations for the type-determined dominant error event, so the error correlation filter checks over few likely positions to find the actual location.

Figure 3:
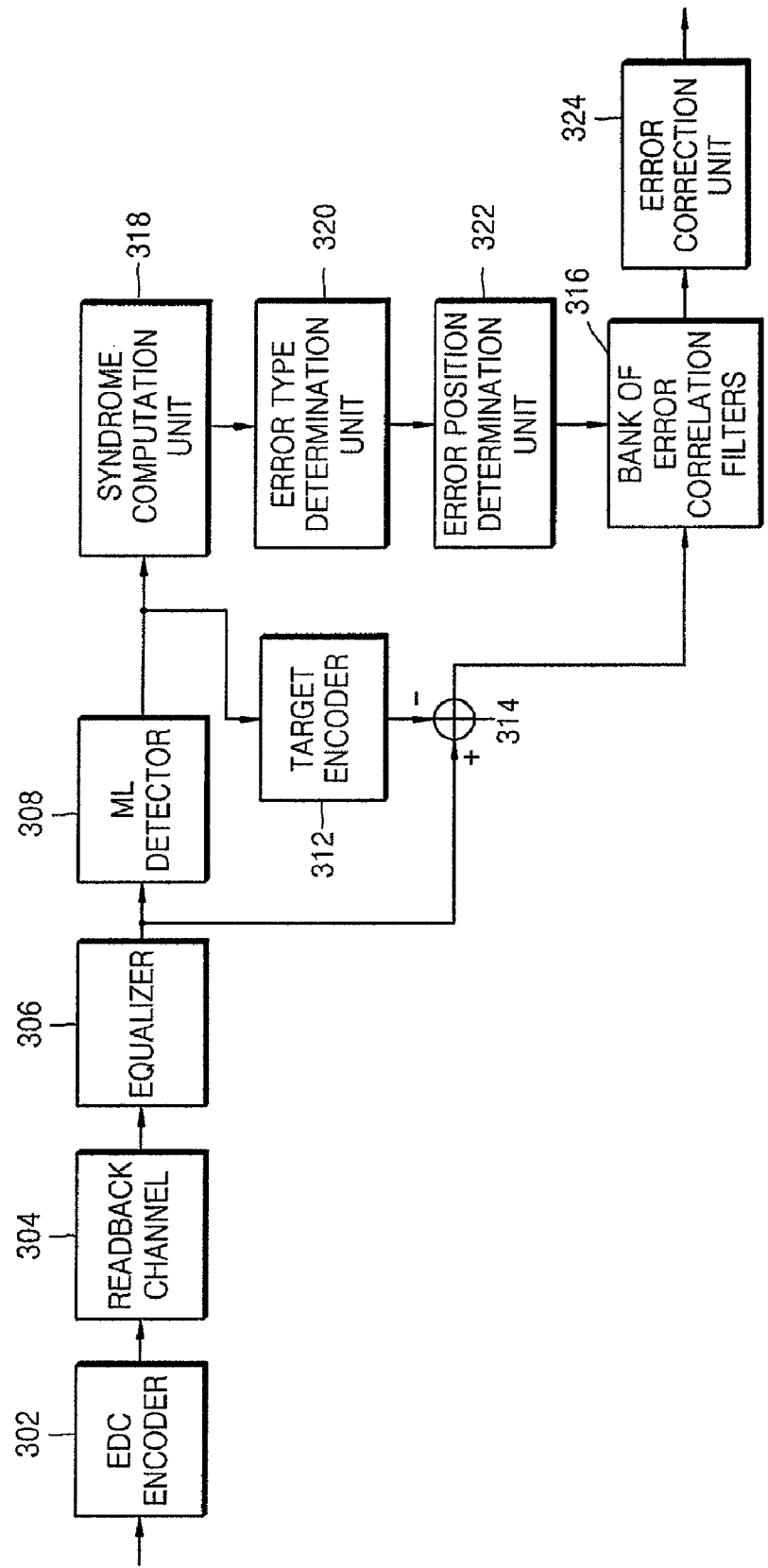
FIG. 3 illustrates a Post-Viterbi processor according to an exemplary embodiment of the present invention.

FIG. 3 illustrates a Post-Viterbi processor according to an exemplary embodiment of the present invention, which comprises a target encoder 312, a bank of error correlation filters 316, a syndrome computation unit 318, an error type determination unit 320, an error position determination unit 322, and an error correction unit 324.

An EDC encoder 302 encodes data before it is transmitted through a readback channel 304. The EDC encoder 302 generates a cyclic codeword by using a non-primitive generator polynomial according to the exemplary embodiment of the present invention described with reference to FIG. 2.

An equalizer 306 equalizes data received through the readback channel 304 and then a ML detector 308 detects the equalized readback data. A syndrome computation unit 318 computes a syndrome for output of the ML detector 308.

Once a non-zero syndrome is computed, the type of an occurred dominant error event is determined by the error type determination unit 320. Based on the syndrome value, likely positions for the occurred dominant error event are chosen by the error position determination unit 322. Among six error correlation filters (at density 1.4) of the bank of error correlation filters 316, only one error correlation filter associated with the selected dominant error event works, and the other error correlation filters do not work. The working error correlation filter now tries to find the maximum position out of the filter output over likely locations only. Finally, the correction unit 324 corrects the occurred dominant error event. In this exemplary embodiment shown in FIG. 6, the syndrome computation unit 318, the error type determination unit 320 and the error position determination unit 322 are implemented separately. However it must be appreciated that these elements can be integrated into a single element, for example the syndrome computation unit 318.

Although the CRC error detection code can determine the type of any single occurrence of a dominant error event within a codeword, a dominant error event at a codeword boundary (end-around case) should also be considered for correction. A set of dominant error events contains ±[2, −2], ±[2, −2, 2], ±[2, −2, 2, −2], ±[2, −2, 2, −2, 2], ±[2, −2, 0, 2, −2] and ±[2, −2, 2, −2, 2, −2] at density 1.4. Mostly, a dominant error event at codeword boundary yields another dominant error event. For example, when a dominant error event±[2, −2, 2, −2] occurs evenly between two codewords, the resulting error events are ±[2, −2] in each codeword. However, this is not always the case. If a most dominant error event±[2, −2] occurs at codeword boundary, then the resulting error event becomes a single error event±[2], and a dominant error event±[2, −2, 0, 2, −2] occurring at the codeword boundary, may be either ±[2, −2, 0, 2] or ±[−2, 0, 2, −2]. Considering all possible cases, it is found that it is necessary to count ±[2], ±[2, −2, 0, 2] and ±[−2, 0, 2, −2] as additional possible dominant error events within a codeword. To find out whether the type of the error events at the codeword boundary can be determined, a syndrome set is listed in Table 9.

TABLE 9

Syndrome set associated with dominant error event and end-around case

|  | Syndrome by $g_3(x)$ in polynomial form | Syndrome sequence in decimal number |
|---|---|---|
| Dominant error event |  |  |
| ±[2, −2] | $1 + x$ | [24, 12, 6, 3, 23, 29] |
| ±[2, −2, 2] | $1 + x + x^2$ | [28, 14, 7, 21] |
| ±[2, −2, 2, −2] | $1 + x + x^2 + x^3$ | [30, 15, 17] |
| ±[2, −2, 2, −2, 2] | $1 + x + x^2 + x^3 + x^4$ | [31, 25, 26, 13, 16, 8, 4, 2, 1, 22, 11, 19] |
| ±[2, −2, 0, 2, −2] | $1 + x + x^3 + x^4$ | [27] |
| +[2, −2, 2, −2, 2, −2] | $x + x^4$ | [9, 18] |
| Dominant error event at boundary |  |  |
| ±[2] | $x$ | [16, 8, 4, 2, 1, 22, 11, 19, 31, 25, 26, 13] |
| ±[2, 0, 2, −2] | $1 + x^2 + x^3$ | [22, 11, 19, 31, 25, 26, 13, 16, 8, 4, 2, 1] |
| ±[2, −2, 0, 2] | $1 + x + x^3$ | [26, 13, 16, 8, 4, 2, 1, 22, 11, 19, 31, 25] |

Unfortunately, the syndrome sets for the end-around case are the same as the syndrome sequence for a dominant error event±[2, −2, 2, −2, 2], so that it is possible to produce a misselection between a dominant error event±[2, −2, 2, −2, 2] and dominant error events at the codeword boundaries. But, since the frequency of a dominant error event±[2, −2, 0, 2, −2] is approximately 1%, the probability of the occurrence of either ±[−2, 0, 2, −2] or ±[2, −2, 0, 2] will be very small enough to ignore the end-around case for the error event±[2, −2, 0, 2, −2]. However, as shown in FIG. 4, the probability of the occurrence of single error event±[2] will be considerable because it can occur from any dominant error events.

Although the syndrome sets for dominant error event±[2, −2, 2, −2, 2] and single error event±[2] are the same, the single error event±[2] mostly occurs either at the end or beginning of a codeword because the single error event is not a dominant error event, but caused by the end-around case. When a single error event occurs at the ending position of a codeword, the corresponding syndrome must be 13. Similarly, a single error event occurred at the beginning position of a codeword must yield syndrome 16. For the cases in FIG. 4, their syndromes are given in FIG. 5.

Previously, whenever syndrome is either 31, 25, 26, 13, 16, 8, 4, 2, 1, 22, 11 or 19, the detected error event is considered as ±[2, −2, 2, −2, 2]. But, considering the end-around case (single error event) additionally, when syndrome is computed as either 13 or 16, the detected error event can be a single error event in the ending or beginning position in a codeword, respectively.

Therefore, the Post-Viterbi error correction method of the present invention adds extra error correlation filter associated with single error event. But, the complexity is not significant because the likely position is only one. If syndrome is 13, then two error correlation filters associated with ±[2, −2, 2, −2, 2] and ±[2] work to find actual position of the detected error event. Since the syndrome is 13, the error correlation filter for single error event checks only the last position in the codeword. Eventually, between two maximum values for two error correlation filters, Post-Viterbi chooses the larger value, and produces the corresponding positions of the error event. There may exist some ambiguity to choose the actual error event and position.

Figure 6:
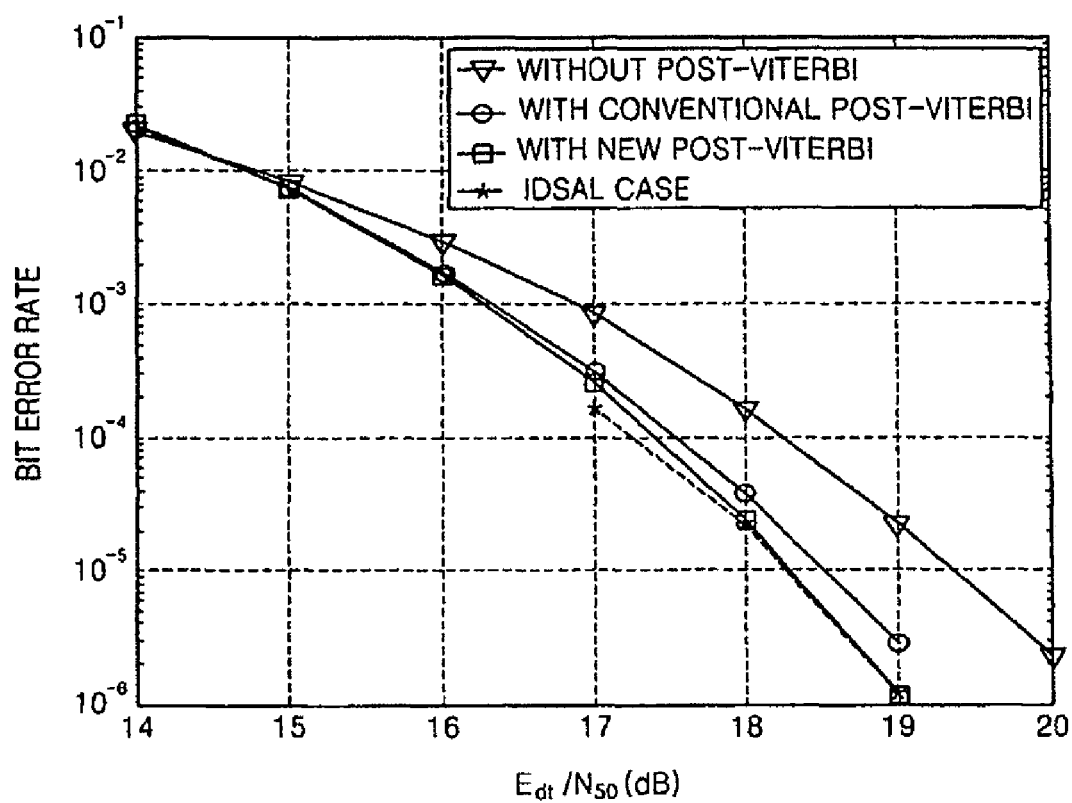
FIG. 6 illustrates the comparison of BERs at user density 1.4 according to the present invention.

With the Post-Viterbi error correction method based on a (252, 247) CRC error detection code, the bit error rates (BERs) are simulated for various SNRs, and compared to the BERs of a conventional Post-Viterbi processor based on a (203, 200) CRC code in FIG. 6. As a reference, uncoded BER and the ideal BER, which counts non-dominant error events only, are also shown. To achieve user density 1.4, the corresponding channel densities for (252, 247) CRC code and (203, 200) CRC code are 1.4283 and 1.4210, respectively. The target response is [1, 6, 7, 2] and the mixed noise contains 50% medium noise and 50% AWGN for the BER simulation.

It is seen that both Post-Viterbi processors produce good performance gains compared to the uncoded case. In particular, the Post-Viterbi error correction method of the present invention gives better performance gain than the conventional one. The comparison of correctability for each error type between two methods is summarized in Table 10. The probability of occurrence of each error type is also shown. The correctability check and the occurrence probabilities are obtained from captured error events and error events after Post-Viterbi error correction associated with each codeword block at BER=$2.2600 \times 10^{-5}$.

As expected, the generated error events mostly consist of a set of a dominant error event within a codeword and at codeword boundary. (95.15%) While the conventional Post-Viterbi processor gives considerable miscorrection for the set of dominant error events, the present invention yields very rare miscorrection because the type is exactly determined and actual error position must be in a set of likely positions based on the syndrome value. The miscorrection of the conventional method here produces either an error event of the same length as the occurred dominant error event due to mispositioning, or an error event even longer than the occurred one due to misselection.

Thus, the considerable miscorrection in the conventional Post-Viterbi processor is the main source of bit errors at the output of detector. Although a dominant error event occurs at codeword boundary, the two separate dominant error events become either another version of dominant error events or two single error events±[2]. Since the present invention cares about the single error event, it can be corrected with very high probability.

For multiple dominant error events within a codeword, the conventional method may have more chance to correct one of them because an associated error correlation filter just tries to find a position yielding maximum value through all positions in a codeword block. But, the present invention fails to correct them because multiple dominant error events within a codeword can't give correct information about the type.

For example, suppose that a dominant error event [2, −2] occurs in the $7^{th}$ and $8^{th}$ positions within a codeword. Also, suppose that the same error event occurs in the $116^{th}$ and $117^{th}$ positions within the codeword. Then, the syndrome values for the first and second error events are 24 and 12, respectively, i.e., [1 1 0 0 0] and [0 1 1 0 0]. The resulting syndrome value is then 20, i.e. [1 0 1 0 0]. Based on the syndrome value 20, the type of the occurred dominant error event at all in Table 9 cannot be found, so the multiple dominant error events cannot be corrected. As another example, suppose that two dominant error events [2, −2] and [2, −2, 2] occur in the positions 13 and 14, and 197, 198 and 199, respectively. Then, the syndrome values for the two dominant error events are 24 and 28, i.e. [1 1 0 0 0] and [1 1 1 0 0]. So, the resulting syndrome becomes 4, i.e. [0 0 1 0 0]. The syndrome value 4 makes the detector determine the occurred error event is dominant error event [2, −2, 2, −2, 2], which is misselection. However, although the present invention does not work well for multiple dominant error events within a codeword, the frequency of the case is small (around 2.0%) compared to the frequencies of the other occurrence cases.

For multiple error events at codeword boundaries, both methods do not correct the error events. Likewise, for a single or multiple non-dominant error event(s) either within a codeword or at codeword boundaries, both methods do not attempt to correct them, which is inevitable.

As the SNR increases, multiple dominant error events or non-dominant error event(s) occur very rarely. Therefore, while both methods give similar performance at SNR=14, 15 and 16 dB, the present invention produces better performance gains from SNR=17 dB. The performance gains compared to the conventional methods are around 0.15 dB and 0.3 dB at BER=$10^{-4}$ and $10^{-5}$, respectively. In addition, the BERs of the present invention at 18 and 19 dB almost achieve the ideal BERs because most error events are dominant error events, and the dominant error events tend to occur once within a codeword.

of doing this calculation is based on the multinomial distribution for the probabilities of the occurrences of symbol errors associated with their length.

For each length-i symbol error, where i=1, ... k, let $x_i$ and $p_i$ respectively be the number and the probability of occurrence, respectively. The probability density function based on the multinomial distribution is then described by $$f_{X_1,\ldots,X_k}(x_1,\ldots,x_k) = \frac{n!}{x_1!x_2!\ldots x_{k+1}!} \cdot p_1^{x_1} p_2^{x_2} \ldots p_{k+1}^{x_{k+1}} \quad (6)$$

Here $X_{k+1}$ and $p_{k+1}$ denote the number and the probability of no erroneous symbols in a sector, and accordingly, $$\sum_{i=1}^{k+1} p_i = 1 \text{ and } \sum_{i=1}^{k+1} x_i = n.$$

The probabilities $p_i$'s are estimated from the captured symbol error statistics.

To compute the SER for a 512-information-byte sector, a shortened RS code based on $GF(2^{10})$ is used. The overall user density $D'_u$ taking into account the outer RS code is defined as $D'_u=D_u \cdot R'$, where R' is the code rate of the outer RS code. Since an (n, k, t) shortened RS code can correct up to t symbol errors in a sector and does not require an interleaving, the probability of an uncorrectable sector, which is the SER, is simply given by $$P_{sector} = 1 - \sum_{x_1} \ldots \sum_{x_k} f_{X_1,\ldots,X_k}(x_1,\ldots,x_k) \quad (7)$$

TABLE 10

Comparison of correctability between conventional and new schemes

| Error type | Occurrence Probability | Correctability (Conventional scheme) | Correctability (New scheme) |
|---|---|---|---|
| Signal error event in a codeword | | | |
| Dominant error event within a codeword | 92.5% | Yes (unignorable miss-correction) | Yes (very rare miss-correction) |
| Dominant error event at codeword boundary | 2.65% | Yes (unignorable miss-correction) | Yes (very rare miss-correction) |
| Non-dominant error event | 2.70% | No | No |
| Multiple error events in a codeword | | | |
| Dominant error events within a codeword | 2.00% | Partial correction/ No (sometimes) | No |
| Dominant error events at codeword boundaries | 0.05% | No | No |
| Non-dominant error events | 0.10% | No | No |

(Note: The occurrence probabilities are obtained at the uncoded BER = 2.2600 × $10^{-5}$)

An (n, k, t) Reed-Solomon (RS) code, can correct up to t symbol errors in an n-symbol code block including k information symbols. Here the sector error rate (SER) is computed, defined as the ratio of the number of uncorrectable sectors to the total number of transmitted sectors, under the assumption that an outer RS code is applied. One popular way where the sum is over all combinations of $x_1,\ldots,x_k$ such that $$\sum_{i=1}^{k} i \cdot x_i \leq t.$$

Table 11 illustrates the sample probabilities of generated symbol errors associated with their lengths at the output of the uncoded ML detector, the conventional Post-Viterbi processor and the method of the present invention at various SNRs (16, 17 and 18 dB). To obtain correct statistics of symbol errors, a very large number of symbol errors should be generated so that each probability $p_i$ converges to its true value. As seen in Table 11, while both conventional method and the present invention give similar length-1 and slightly different length-2 symbol error statistics, conventional Post-Viterbi processor statistically produces length-3 burst errors, mostly because of the miscorrection of the conventional method.

TABLE 11

An example of statistics of symbol errors at 16, 17 and 18 dB

|  | $p_1$ | $p_2$ | $p_3$ |
|---|---|---|---|
| SNR = 16 dB |  |  |  |
| Uncoded ML | $8.3400 \times 10^{-3}$ | $2.0840 \times 10^{-3}$ | $1.6000 \times 10^{-5}$ |
| Conventional Post-Viterbi | $4.9400 \times 10^{-3}$ | $1.2000 \times 10^{-3}$ | $2.0000 \times 10^{-5}$ |
| New post-Viterbi | $4.5074 \times 10^{-3}$ | $1.4845 \times 10^{-3}$ |  |
| SNR = 17 dB |  |  |  |
| Uncoded ML | $2.4300 \times 10^{-3}$ | $5.7600 \times 10^{-4}$ |  |
| Conventional Post-Viterbi | $5.4400 \times 10^{-4}$ | $2.2000 \times 10^{-4}$ | $3.0000 \times 10^{-6}$ |
| New post-Viterbi | $5.3441 \times 10^{-4}$ | $2.2672 \times 10^{-4}$ |  |
| SNR = 18 dB |  |  |  |
| Uncoded ML | $4.9500 \times 10^{-4}$ | $1.1850 \times 10^{-4}$ |  |
| Conventional Post-Viterbi | $4.2500 \times 10^{-5}$ | $3.2800 \times 10^{-5}$ | $2.0000 \times 10^{-7}$ |
| New post-Viterbi | $3.8583 \times 10^{-5}$ | $1.6437 \times 10^{-5}$ |  |

Figure 7:
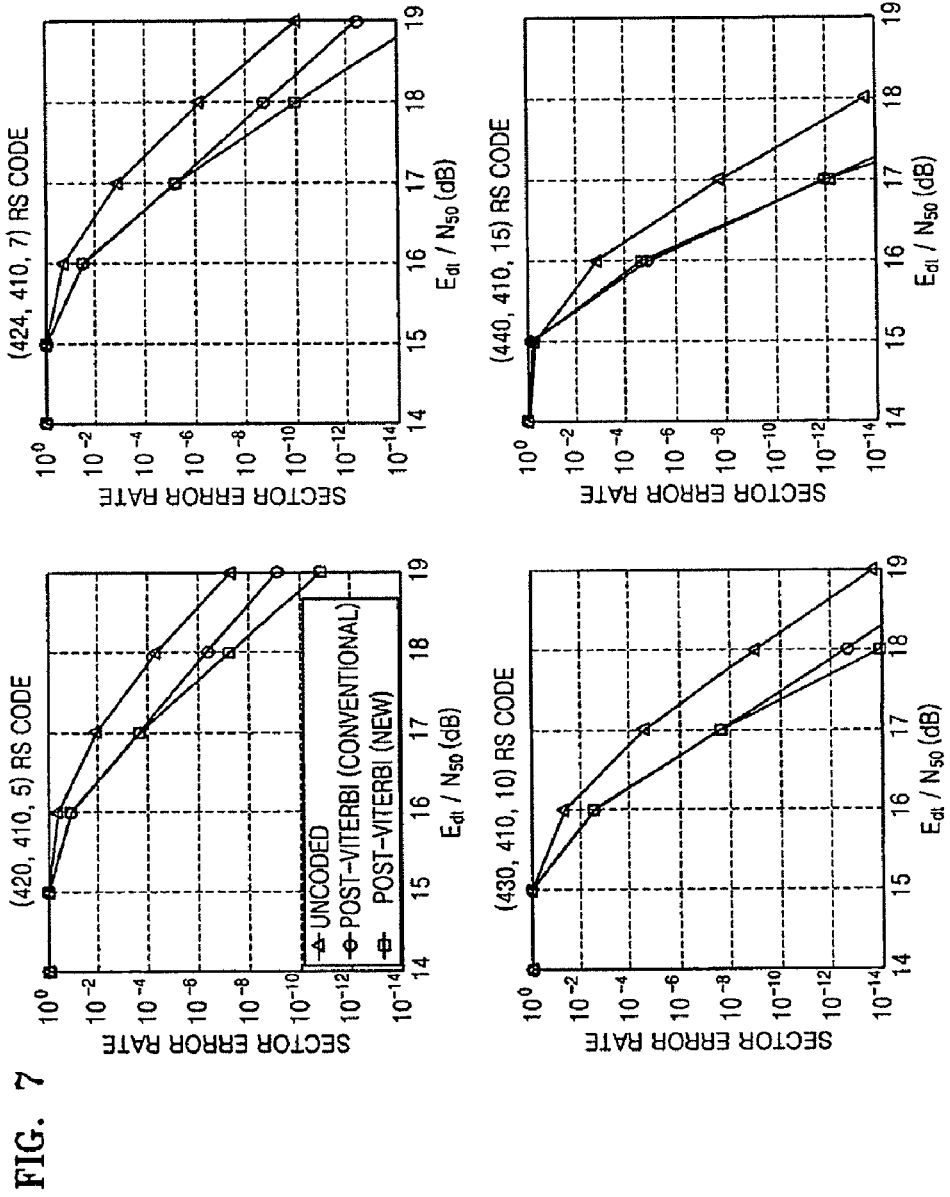
FIG. 7 illustrates the comparison of SERs of the three methods for various RS codes according to the present invention.

FIG. 7 illustrates the comparison of SERs of the three methods for various RS codes, i.e., (420, 410, 5), (424, 410, 7), (430, 410, 10) and (440, 410, 15) RS codes. The overall user densities ($D'_u$) are 1.3667, 1.3538, 1.3349 and 1.3045 for each RS code. It is seen in FIG. 7 that both conventional Post-Viterbi error correction method and the Post-Viterbi error correction method of the present invention clearly give SER performance gains compared to the uncoded case, and the present invention produces better SER performance gain than the conventional method at SNRs higher than 17 dB. The performance gain with the statistics of burst errors listed in Table 11 can be explained: the conventional method yields longer burst errors in general, and the occurrence probability of burst errors in the present invention is lower at 18 dB. As a result, the SNR gain at SER=$10^{-12}$ is seen to be around 0.46 dB and 0.2 dB with (424, 410, 7) and (430, 410, 10) RS codes, respectively. It is also observed that the performance gain is smaller because as the number of correctable symbol is increased, the SER of $10^{-12}$ is achieved at lower SNR, and the two SERs are similar up to 17 dB.

As described above, according to exemplary embodiments of the present invention, based on a set of dominant error events in perpendicular recording, a non-primitive generator polynomial is induced that produces a unique set of syndromes for each dominant error event. Consequently, each set of syndromes corresponds to only one dominant error event.

Then, the type of an occurred dominant error event can be immediately determined by one syndrome computation without any ambiguity, which almost eliminates the misselection in a conventional Post-Viterbi processor for a single dominant error event within a codeword.

Moreover, using a periodic property of the syndrome set and characteristic of the type-determined error event, a set of likely error positions for the detected dominant error event can also be obtained. Afterwards, an error correlation filter associated with the determined type tries to find actual error position among the given likely error positions.

Since the actual error position must be in the set of likely error positions, the probability of the mispositioning in a conventional method can be subsequently reduced. It is shown through computer simulations that the Post-Viterbi error correction method of the present invention performs better than a conventional Post-Viterbi processor at moderate to high signal-to-noise ratio because of considerably low probability of the miscorrection, which consists of the misselection and the mispositioning.

Exemplary embodiments of the present invention can be embodied as a method, an apparatus, or a system. When embodied as computer readable code/instructions, e.g., software, elements of exemplary embodiments of the present invention may be implemented by code segments, for example. Programs and/or the code segments may be stored in a medium, e.g., a computer-readable recording medium, and/or may be transmitted through a transmission medium and/or over a communications network as computer data signals associated with carrier waves. Examples of the medium may include nearly all kinds of media for storing and/or transmitting data. For example, the medium can include at least an electronic circuit, a semiconductor memory device, a ROM, a flash memory, an erasable ROM, a floppy disk, an optical disk, a hard disk, an optical fiber medium, and a radio frequency (RF) network, etc. Examples of computer data signals include nearly all types of signals that are storable and/or transmittable on such a storage/transmission medium as an electronic network channel, an optical fiber, air, an electromagnetic system, and an RF network, for example.

Exemplary embodiments of the present invention can also be applied not only to various disk drives, such as hard disk drives, but to other types of data storage devices.

Thus, although a few exemplary embodiments of the present invention have been shown and described, it would be appreciated by those skilled in the art that changes might be made in these exemplary embodiments without departing from the principles and spirit of the invention, the scope of which is defined in the claims and their equivalents.

What is claimed is:

1. A method for generating a codeword from data, the method comprising:
   obtaining a set of dominant error events from intersymbol interference characteristics of magnetic recording media;
   constructing a non-primitive generator polynomial, the constructing comprising:
      factorizing a dominant error event polynomial from the set of dominant error events; and
      determining an irreducible factor of the dominant error event polynomial and a maximum power of the irreducible factor; and
   generating by a processor, a codeword from the data using the non-primitive generator polynomial that produces a unique syndrome set which specifies one of the set of dominant error events.

2. The method of claim 1, wherein the set of dominant error events includes an error event whose frequency of occurrence represents more than or equal to 1% of overall occurrences of all error events.

3. The method of claim 1, wherein the dominant error event is at least one of $\pm\{+\}$, $\pm\{+-\}$, $\pm\{+-+\}$, $\pm\{+-+-\}$, $\pm\{+-+-+\}$, $\pm\{+-+-+-\}$, $\pm\{+-+-+-+\}$, $\pm\{+-+-+-+-\}$, $\pm\{+-+-+-+-+\}$, ±{+−+−+−+−−}, ±{+−+−+−+−+}, ±{+−+−+−+−+−},
±{+−+−+−+−+−+}, ±{+−+−+−+−+−}, ±{+−0+−},
±{+−0+−0+−}, ±{+−0+−0+−0+−}, ±{+−0 0+−}, ±{+−0 0+−0 0+−} and ±{+−0 0+−0 0+−0 0+−}.

4. The method of claim 1, wherein the non-primitive generator polynomial has a degree m whose period is less than $2^m-1$, wherein m is a positive integer.

5. The method of claim 1, the constructing the non-primitive generator polynomial
further comprises generating a multiplication of irreducible factors associated with the maximum power.

6. The method of claim 1, wherein the codeword is a cyclic codeword.

7. A method for generating a codeword from data, the method comprising:

obtaining a set of dominant error events from intersymbol interference characteristics of magnetic recording media; and generating by a processor, a codeword from the data using a non-primitive generator polynomial that produces a unique syndrome set which specifies one of the set of dominant error events, wherein the generating the codeword comprises:

calculating a shifted data polynomial from the data;

dividing the shifted data polynomial by the non-primitive generator polynomial and calculating a remainder; and obtaining the codeword in which the remainder is added to the data.

* * * * *